(12) United States Patent
Shin

(10) Patent No.: US 8,222,148 B2
(45) Date of Patent: Jul. 17, 2012

(54) METHOD OF MANUFACTURING A SEMICONDUCTOR DEVICE

(75) Inventor: Wan Cheul Shin, Chungcheongnam-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 333 days.

(21) Appl. No.: 12/546,064

(22) Filed: Aug. 24, 2009

(65) Prior Publication Data

US 2010/0003801 A1  Jan. 7, 2010

Related U.S. Application Data

(60) Division of application No. 11/706,700, filed on Feb. 15, 2007, now Pat. No. 7,595,558, which is a continuation of application No. 11/647,837, filed on Dec. 29, 2006, now abandoned.

(30) Foreign Application Priority Data

Feb. 16, 2006 (KR) .................. 2006-15004

(51) Int. Cl.
*H01L 21/311* (2006.01)

(52) U.S. Cl. . 438/700; 438/270; 438/684; 257/E21.231; 257/E21.544; 257/E21.545; 257/E21.56; 257/E21.628

(58) Field of Classification Search .............. 438/700, 438/270, 637, 684, 509, 510, 513, 514; 257/E21.56, 257/231, 544, 545, 628
See application file for complete search history.

(56) References Cited

U.S. PATENT DOCUMENTS

| | | | |
|---|---|---|---|
| 4,862,240 A | | 8/1989 | Watanabe et al. |
| 5,181,091 A | | 1/1993 | Harrington, III et al. |
| 5,668,755 A | * | 9/1997 | Hidaka ................. 365/182 |
| 5,726,475 A | | 3/1998 | Sawada et al. |
| 5,894,145 A | | 4/1999 | Chen et al. |
| 5,943,595 A | * | 8/1999 | Akiyama et al. .......... 438/527 |
| 6,009,017 A | * | 12/1999 | Guo et al. ............. 365/185.28 |
| 6,025,621 A | | 2/2000 | Lee et al. |
| 6,037,203 A | | 3/2000 | Kim |
| 6,252,269 B1 | * | 6/2001 | Hasegawa et al. .......... 257/306 |
| 6,300,209 B1 | | 10/2001 | Oh ...................... 438/370 |
| 6,773,992 B2 | | 8/2004 | Doi |
| 7,595,558 B2 | * | 9/2009 | Shin .................... 257/774 |

FOREIGN PATENT DOCUMENTS

KR 101999007763  10/1999

* cited by examiner

*Primary Examiner* — David Nhu
(74) *Attorney, Agent, or Firm* — Marshall, Gerstein & Borun LLP

(57) ABSTRACT

A semiconductor device includes a first well formed in a predetermined region of a semiconductor substrate, a second well formed in a predetermined region in the first well, and a third well formed in the first well with the third well being spaced apart from the second well at a predetermined distance. A multiple well of the semiconductor substrate, the first well, the second well, the first well, and the third well, which are sequentially disposed, is formed. Accordingly, a breakdown voltage can be increased and a leakage current can be reduced. It is therefore possible to prevent the drop of an erase voltage and to reduce the error of an erase operation.

12 Claims, 4 Drawing Sheets

METHOD OF MANUFACTURING A SEMICONDUCTOR DEVICE

CROSS-REFERENCE TO RELATED APPLICATIONS

This is a division of U.S. application Ser. No. 11/706,700 filed Feb. 15, 2007, now U.S. Pat. No. 7,595,558, and claims continuing status under 35 U.S.C. 120 based on U.S. application Ser. No. 11/647,837 filed Dec. 29, 2006, now abandoned both of which claim the priority benefit under USC 119 of KR-2006-15004 filed Feb. 16, 2006, the entire respective disclosures of which are incorporated herein by reference.

BACKGROUND OF THE INVENTION

The invention relates in general to a semiconductor device and a method of manufacturing the same and, more particularly, to a semiconductor device and a method of manufacturing the same, wherein leakage current occurring due to a parasitic bipolar transistor by a triple well structure at the time of erasure can be prevented.

An NAND flash memory device performs data program by injecting electrons into the floating gate by Fowler-Nordheim (FN) tunneling. The NAND flash memory device provides a large capacity and a high level of integration.

The NAND flash memory device includes a number of cell blocks. Each cell block includes a number of cell strings in which a number of cells for storing data are connected in series to form one string, and a drain select transistor and a source select transistor formed between the cell string and the drain, and the cell string and the source, respectively. Each cell block further includes a peri region in which a number of circuit elements for generating a predetermined bias for the program, erasure, and read operations of a cell and transferring the bias are formed.

Furthermore, cells that constitute different cell strings and are driven by the same word line (WL) form a page. Gates of a number of drain select transistors are commonly connected to a drain select line (DSL) and are driven by the potential of the drain select line. Gates of a number of source select transistors are commonly connected to a source select line and are driven by the potential of the source select line.

The NAND flash memory cell includes a gate in which a tunnel oxide layer, a floating gate, a dielectric layer, and a control gate are laminated in a predetermined region of a semiconductor substrate, and a junction formed on the semiconductor substrate at both sides of the gate.

A NAND flash memory device constructed as described above is an electrically programmable and erasable device, and it performs program and erase functions in such a manner that electrons vary the threshold voltage while being moved due to a strong electric field through a thin tunnel oxide layer.

The NAND flash memory device implements erasure on a block basis. For the purpose of erasure, it is necessary that a ground voltage (Vss) be applied to the entire word lines of a selected cell block and a high voltage of about 20 V be applied to the well.

As described above, the NAND flash memory device performs the erasure operation by applying a high voltage typically of about 20 V, to the well. Accordingly, the semiconductor substrate of the cell region must have a triple well structure. That is, an N well is formed on a P-type semiconductor substrate and a P well is formed on an N well, thereby forming the triple well structure. In this case, a parasitic bipolar transistor is formed between the semiconductor substrate, the N well, and the P well.

The parasitic bipolar transistor keeps turned off with a high voltage not being applied to the well. However, if a high voltage of about 20 V is applied to the well for erasure, the parasitic bipolar transistor is turned on and the leakage current is generated accordingly. More particularly, a great amount of leakage current is generated at the boundary of the cell region and the peri region. The leakage current causes to drop an erase voltage, resulting in the failure of the erase operation.

SUMMARY OF THE INVENTION

In one embodiment, the invention relates to a semiconductor device and a method of manufacturing the same, wherein drop of an erase voltage, which is incurred by the leakage current between the cell region and the peri region due to the parasitic bipolar transistor at the time of erasure can be prevented.

The semiconductor substrate of the cell region has multiple wells of triple or more wells. More particularly, the P well is further formed in the N well, forming the well of a PNPN structure. If so, a breakdown voltage can be increased compared with an existing PNP structure, the leakage current can be reduced, and the drop of an erase voltage can be prevented.

A semiconductor device according to one aspect of the invention includes a first well region formed in a semiconductor substrate, a second well region formed in the first well region and divide form the first well region, and a third well region formed in the first well region and being adjacent to a surface of the semiconductor substrate on the second well region.

According to another aspect, the invention provides a method of manufacturing a semiconductor device, including the steps of forming a first well region in a semiconductor substrate, forming a trench in the semiconductor substrate of the first well region, filling the trench with a polysilicon layer, forming an impurity region connected to a bottom of the polysilicon layer in the first well region, thus forming a second well region to divide the first well region, and forming a third well region formed in the first well region and being adjacent to a surface of the semiconductor substrate on the second well region.

According to still another aspect, the invention provides a method of manufacturing a semiconductor device, including the steps of forming a first well region in a semiconductor substrate, forming a second well region formed in the first well region and divide from the first well region, and forming a third well region formed in the first well region and being adjacent to a surface of the semiconductor substrate on the second well region.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DESCRIPTION OF SPECIFIC EMBODIMENTS

The invention will now be described in detail in connection with certain exemplary embodiments with reference to the accompanying drawings.

FIGS. 1A to 1E are cross-sectional views illustrating a method of manufacturing a semiconductor device according to an embodiment of the invention.

Figure 1A:
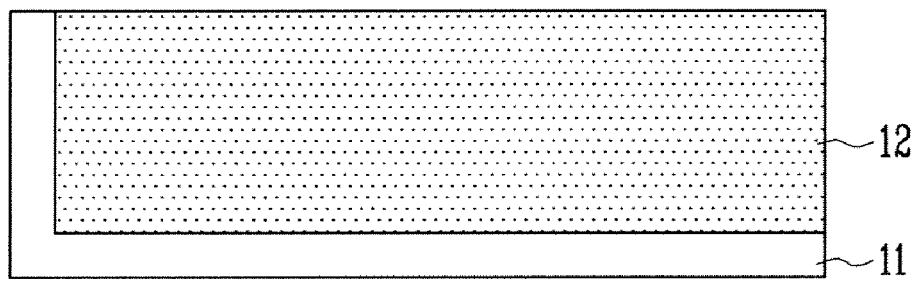
FIGS. 1A to 1E are cross-sectional views illustrating a method of manufacturing a semiconductor device according to an embodiment of the invention.

Referring to FIG. 1A, a first photoresist layer (not shown) is formed on a semiconductor substrate 11. The first photoresist layer (not shown) is patterned by photolithography and development processes employing a mask through which a predetermined region (for example, a cell region) of the semiconductor substrate 11 is exposed. Accordingly, the semiconductor substrate 11 of the cell region is exposed.

An N-type impurity (for example, phosphorous (P) ion) is then injected with a predetermined energy and dose to form a first well 12. In other words, the first well 12 is formed by injecting the N-type impurity into the cell region of the semiconductor substrate 11.

Figure 1B:
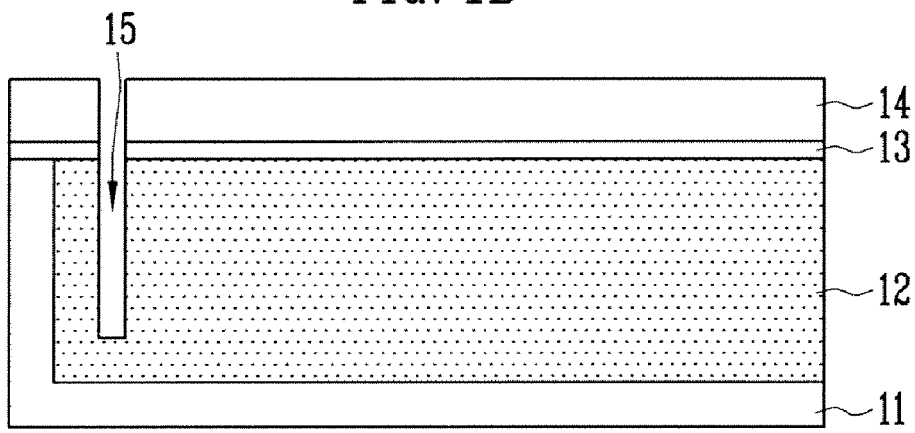

Referring to FIG. 1B, an oxide layer 13 and a nitride layer 14 are formed on the semiconductor substrate 11 on which the first well 12 is formed. A second photoresist layer (not shown) is formed on the nitride layer 14. The second photoresist layer (not shown) is patterned by photolithography and development processes using a predetermined mask. The second photoresist layer (not shown) causes the nitride layer 14 of a location at which the first well 12 is formed to be exposed such that a predetermined region of the semiconductor substrate 11 on which the first well 12 is formed is etched in a subsequent etch process.

The nitride layer 14 and the oxide layer 13 are etched using the patterned second photoresist layer (not shown) as a mask. The semiconductor substrate 11 on which the first well 12 is formed is etched to predetermined width and depth, thus forming a trench 15.

Figure 1C:
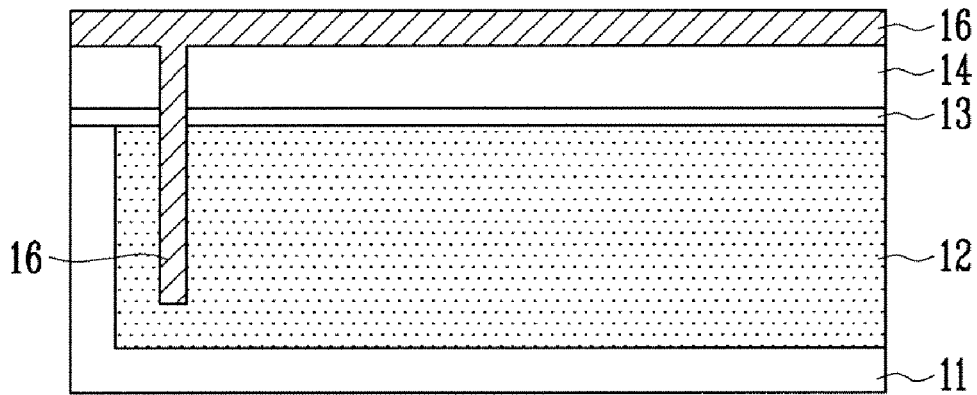

Referring to FIG. 1C, after the second photoresist layer (not shown) is stripped, an annealing process for removing dangling bonds of silicon is implemented. The annealing process may preferably be performed at a temperature of 850° C. to 1100° C. under a nitrogen atmosphere for 30 minutes to one hour. A polysilicon layer 16 is formed on the entire surface so that the trench 15 is gap filled. The polysilicon layer 16 may be one doped with a P-type ion (for example, boron (B) ion) having a concentration of 10 E17 ions/cm$^3$ to 10 E20 ions/cm$^3$.

Figure 1D:
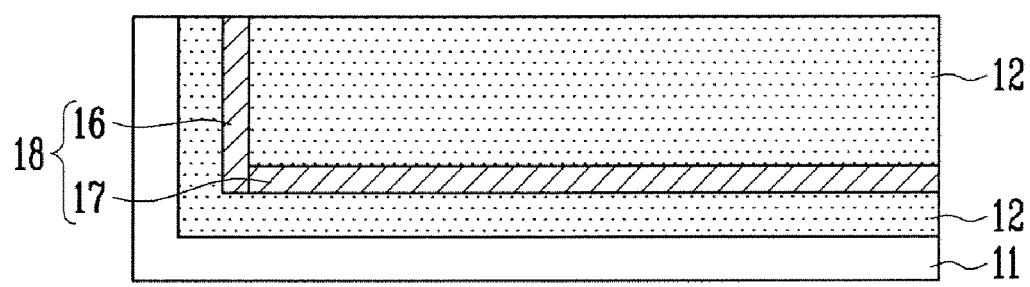

Referring to FIG. 1D, the oxide layer 13, the nitride layer 14, and the polysilicon layer 16 remaining on the semiconductor substrate 11 are stripped. The nitride layer 14 may be stripped using any suitable means, such as phosphoric acid (H$_3$PO$_4$) and the oxide layer 13 may be stripped using HF, for example.

After a third photoresist layer (not shown) is formed on the entire surface, it is patterned by photolithography and development processes using a predetermined mask. The third photoresist layer (not shown) is patterned such that the first well 12 in the trench 15 in which the polysilicon layer 16 is formed is exposed.

A P-type ion (preferably, the same ion (for example, boron (B) ion) as that doped into the polysilicon layer 16) is injected with energy of 200 to 500 keV and dose of 1.0 E12 ions/cm$^2$ to 5.0 E14 ions/cm$^2$. An annealing process is then performed to form an impurity region 17 in the first well 12. The annealing process may preferably be performed at a temperature of 850° C. to 1100° C. under a nitrogen atmosphere for 30 minutes to one hour.

If so, the impurity region 17 is connected to the bottom of the polysilicon layer 16. Accordingly, the polysilicon layer 16 and the impurity region 17 constitutes a P-type second well 18 and the first well 12 is divided by the P-type second well 18.

Figure 1E:
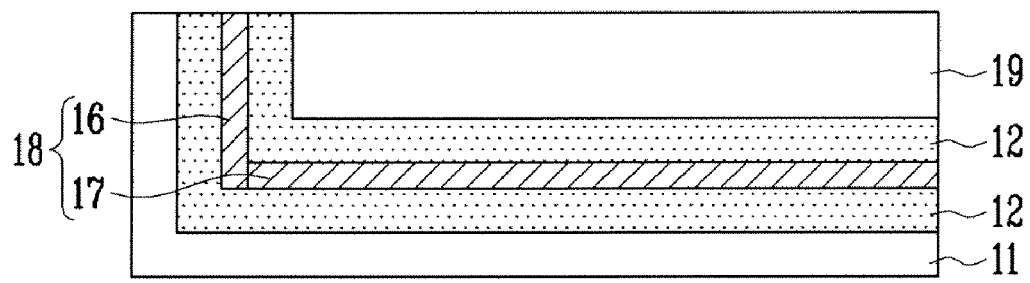

Referring to FIG. 1E, after the third photoresist layer (not shown) is stripped, a fourth photoresist layer (not shown) is formed on the entire surface. The fourth photoresist layer (not shown) is patterned by photolithography and development processes using a predetermined mask. The fourth photoresist layer (not shown) is patterned so that a predetermined region of the first well 12 is exposed with it being apart spaced from the second well 18 at a predetermined distance.

A P-type impurity (for example, boron (B) ion) is injected using the fourth photoresist layer (not shown) as a mask, forming a third well 19. After the fourth photoresist layer (not shown) is stripped, a subsequent process is performed.

FIGS. 2A to 2D are cross-sectional views illustrating a method of manufacturing a semiconductor device according to another embodiment of the present invention.

Figure 2A:
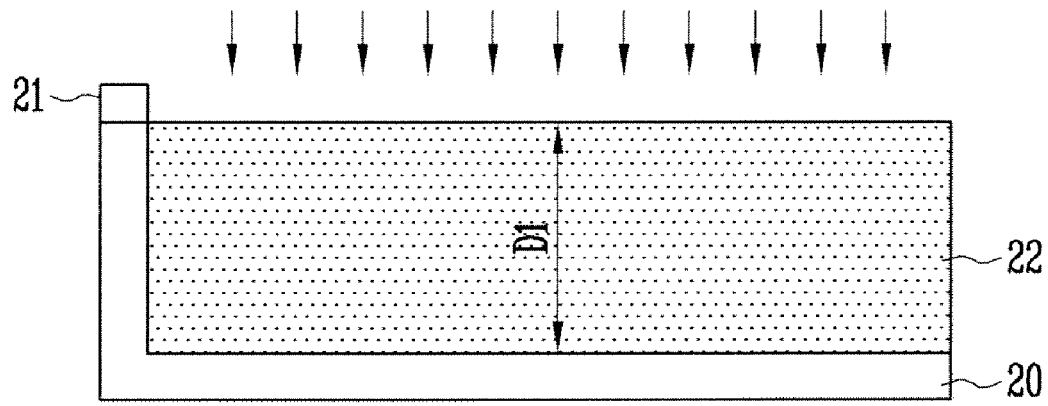
FIGS. 2A to 2D are cross-sectional views illustrating a method of manufacturing a semiconductor device according to another embodiment of the present invention.

Referring to FIG. 2A, a first mask pattern 21 in which a specific region (for example, a cell region) of a semiconductor substrate 20 is opened is formed on a semiconductor substrate 20. A first well region 22 is formed in the semiconductor substrate 20 by means of a first impurity ion implantation process.

The first well region 22 can be formed up to a first depth D1 from a surface of the semiconductor substrate 20 by implanting a first impurity ion, such as phosphorus (P), that is, an N type impurity ion. The first well region 22 can be formed up to a desired first depth D1 by controlling ion implantation energy.

Figure 2B:
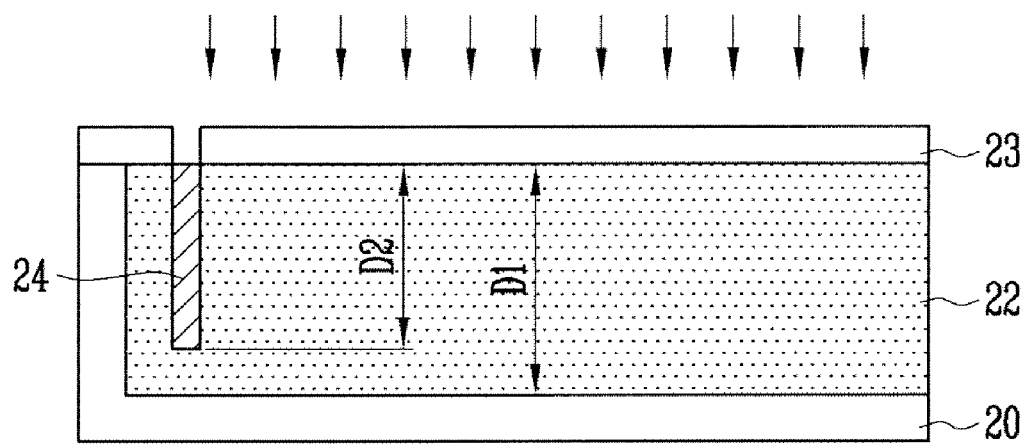

Referring to FIG. 2B, the first mask pattern 21 is removed. A second mask pattern 23 in which a width of the first well region 22 is opened is formed on the semiconductor substrate 20. A first ion implantation region 24 is formed in the first well region 22 by means of a second impurity ion implantation process.

The first ion implantation region 24 can be formed up to a second depth D2 from the surface of the semiconductor substrate 20 by implanting a second impurity ion, such as boron (B), that is, a P type impurity ion. The first ion implantation region 24 can be formed up to a desired second depth D2 by controlling ion implantation energy. The second depth D2 may be shallower than the first depth D1.

Figure 2C:
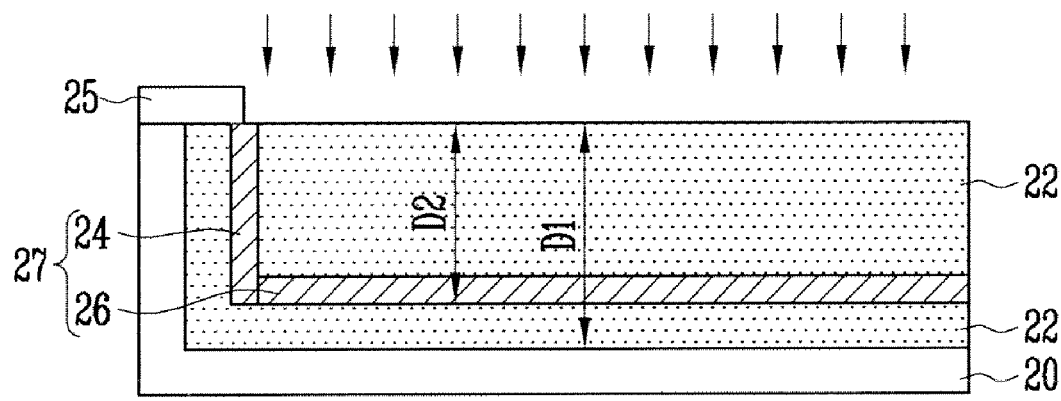

Referring to FIG. 2C, the second mask pattern 23 is removed. A third mask pattern 25 in which a portion of the first ion implantation region 24 and the first well region 22 in the first ion implantation region 24 are opened is formed on the semiconductor substrate 20. A second ion implantation region 26 connected to the bottom of the first ion implantation region 24 in the first well region 22 is formed by means of a third impurity ion implantation process. Accordingly, a second well region 27 comprising the first and second ion implantation regions 24 and 26 is completed.

The second ion implantation region 26 can be formed up to the second depth D2 by implanting a third impurity ion, such as boron (B), that is, a P type impurity ion. The second ion implantation region 26 can be formed up to the second depth D2 by setting ion implantation energy to be the same as or similar as the greatest ion implantation energy at the time of the second impurity ion implantation process.

The first ion implantation region 24 and the second ion implantation region 26 are formed of the same type of an impurity ion. Thus, the first well region 22 and the second well region 27 are formed of impurity ions having opposite types. The second well region 27 formed as a result of the above processes is formed in the first well region 22 and divides the first well region 22.

Figure 2D:
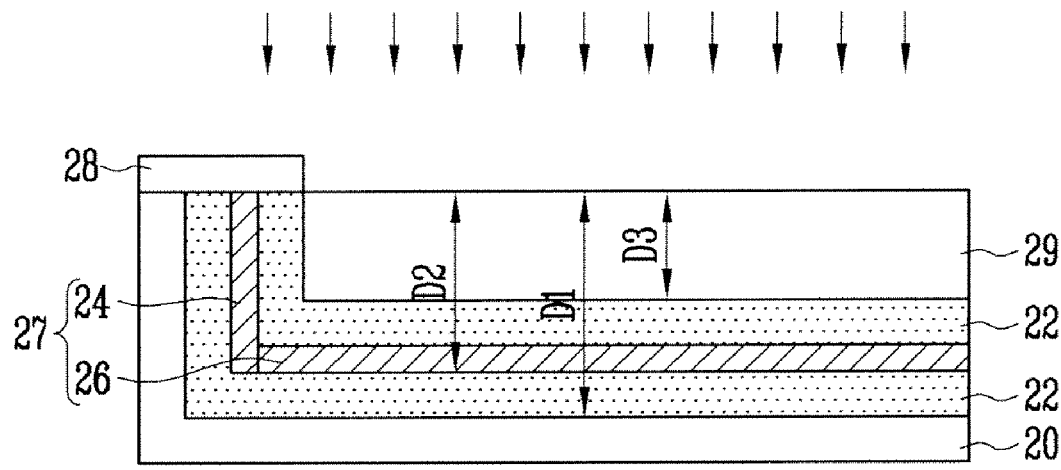

Referring to FIG. 2D, the third mask pattern 25 is removed. A fourth mask pattern 28 in which a portion of the first well region 22 surrounded by the second well region 27 is opened is formed on the semiconductor substrate 20. A third well region 29 is formed in the semiconductor substrate 20 by means of a fourth impurity ion implantation process.

The third well region 29 can be formed up to a third depth D3 from the surface of the semiconductor substrate 20 by implanting a fourth impurity ion, such as boron (B), that is, a P type impurity ion. The third well region 29 can be formed up to a desired third depth D3 by controlling ion implantation energy. The third depth D3 may be shallower than the second depth D2.

According to the present embodiment, a multi-well structure comprising the N type well region 22, the P type well region 27, the N type well region 22 and the P type well region 29 in the semiconductor substrate 20 can be completed.

As described above, in the NAND flash memory device according to the invention, the semiconductor substrate is formed to have a multiple well structure of triple or more. Accordingly, a breakdown voltage can be increased and a leakage current can be reduced. It is therefore possible to prevent the drop of an erase voltage and to reduce the error of an erase operation.

While the invention has been described in connection with practical exemplary embodiments, the invention is not limited to the disclosed embodiments but, to the contrary, is intended to cover various modifications and equivalent arrangements included in the spirit and scope of the appended claims.

What is claimed is:

1. A method of manufacturing a semiconductor device, comprising:
   forming a first well region in a semiconductor substrate;
   forming a trench in the semiconductor substrate of the first well region;
   filling the trench with a polysilicon layer;
   forming an impurity region connected to a bottom of the polysilicon layer in the first well region, thus forming a second well region to divide the first well region; and
   forming a third well region formed in the first well region and being adjacent to a surface of the semiconductor substrate on the second well region.

2. The method of claim 1, comprising forming the first well region by injecting an N-type impurity.

3. The method of claim 1, further comprising performing an annealing process after forming the trench.

4. The method of claim 3, comprising performing the annealing process under a nitrogen atmosphere.

5. The method of claim 3, comprising performing the annealing process at a temperature of about 850° C. to about 1100° C. for 30 minutes to 60 minutes.

6. The method of claim 1, comprising doping the polysilicon layer with a P-type impurity.

7. The method of claim 1, comprising forming the impurity region is formed by injecting a P-type impurity and then performing an nitrogen annealing process so that the impurity region is connected to the bottom of the polysilicon layer.

8. The method of claim 1, comprising forming the third well by injecting a P-type impurity.

9. A method of manufacturing a semiconductor device, comprising:
   forming a first well region in a semiconductor substrate;
   forming a second well region in the first well region to divide the first well region into an inner well region and an outer well region; and
   forming a third well region in the inner well region of the first well region and being adjacent to a surface of the semiconductor substrate on the second well region.

10. The method as claimed in claim 9, wherein: the first well region is formed of an N-type impurity ion, and the second well and the third well are formed of a P-type impurity ion.

11. The method as claimed in claim 9, wherein forming the second well region comprises: forming a first ion implantation region up to a portion shallower than a depth of the first well region from a surface of the semiconductor substrate; and forming a second ion implantation region connected to a bottom of the first ion implantation region.

12. The method as claimed in claim 11, wherein the second ion implantation region is formed by using the same or similar value as the greatest value of ion implantation energy applied when the first ion implantation region is formed.

* * * * *